United States Patent
Lee et al.

(10) Patent No.: US 11,037,618 B2
(45) Date of Patent: Jun. 15, 2021

(54) ROW HAMMER PREVENTION CIRCUIT, A MEMORY MODULE INCLUDING THE ROW HAMMER PREVENTION CIRCUIT, AND A MEMORY SYSTEM INCLUDING THE MEMORY MODULE

(71) Applicants: SK hynix Inc., Icheon (KR); Seoul National University R&DB Foundation, Seoul (KR)

(72) Inventors: Eojin Lee, Suwon (KR); Ingab Kang, Seoul (KR); Jung Ho Ahn, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/858,468

(22) Filed: Apr. 24, 2020

(65) Prior Publication Data
US 2021/0043248 A1 Feb. 11, 2021

(30) Foreign Application Priority Data
Aug. 6, 2019 (KR) .......................... 10-2019-0095516

(51) Int. Cl.
G11C 11/406 (2006.01)
G11C 11/4076 (2006.01)
G11C 11/409 (2006.01)
G11C 11/408 (2006.01)
G11C 11/4072 (2006.01)

(52) U.S. Cl.
CPC ...... *G11C 11/40622* (2013.01); *G11C 11/409* (2013.01); *G11C 11/4072* (2013.01); *G11C 11/4076* (2013.01); *G11C 11/4082* (2013.01); *G11C 11/4085* (2013.01)

(58) Field of Classification Search
CPC .......... G11C 11/40622; G11C 11/4072; G11C 11/4076; G11C 11/4082; G11C 11/4085; G11C 11/409
See application file for complete search history.

(56) References Cited

U.S. PATENT DOCUMENTS

| | | | |
|---|---|---|---|
| 9,299,400 | B2 | 3/2016 | Bains et al. |
| 9,978,440 | B2 * | 5/2018 | Oho ...................... G11C 11/408 |
| 10,490,250 | B1 * | 11/2019 | Ito ..................... G11C 11/40611 |

(Continued)

FOREIGN PATENT DOCUMENTS

KR 20180022069 A 3/2018

OTHER PUBLICATIONS

Parsec Group, "A Memo on Exploration of SPLASH-2 Input Sets", Jun. 2011, pp. 1-12, Princeton University.
(Continued)

*Primary Examiner* — Mushfique Siddique

(57) ABSTRACT

A row hammer prevention circuit for providing a reference address to perform an additional refresh operation includes a history storage circuit configured to store one or more first addresses, each of the first addresses having been provided as the reference address. The row hammer prevention circuit further includes an address storage circuit configured to store a row address corresponding to an active command, a reference address storage circuit configured to store one or more second addresses, and a control circuit configured to provide the reference address in response to a refresh command.

20 Claims, 11 Drawing Sheets

(56) References Cited

U.S. PATENT DOCUMENTS

| | | | |
|---|---|---|---|
| 2017/0140811 A1* | 5/2017 | Joo | G11C 11/40618 |
| 2018/0261268 A1* | 9/2018 | Hyun | G11C 7/1087 |
| 2019/0066759 A1* | 2/2019 | Nale | G11C 11/40611 |
| 2020/0066329 A1* | 2/2020 | Son | G11C 29/42 |
| 2020/0302994 A1* | 9/2020 | Enomoto | G11C 11/408 |

OTHER PUBLICATIONS

NCSU, "FreePDK45", 2011, pp. 1, https://www.eda.ncsu.edu/wiki/FreePDK45:Contents.

Mohsen Ghasempour et al., "A Run-time Memory Hot-row Detector", 2015, pp. 1.

Brent Keeth et al., "DRAM Circuit Design, Fundamental and High-Speed Topics", IEEE Press Series on Microelectronic Systems, 2007, pp. 21-24, Wiley-IEEE Press.

Bruce Jacob et al., "Memory Systems, Cache, DRAM, Disk", 2007, pp. 352-355, Morgan Kaufmann Publishers Inc.

Dae-Hyun Kim et al., "Architectural Support for Mitigating Row Hammering in DRAM Memories", IEEE Computer Architecture Letters, Jan.-Jun. 2015, pp. 9-12, vol. 14, No. 1.

David Lo et al., "Heracles: Improving Resource Efficiency at Scale", ISCA '15, Jun. 13-17, 2015, pp. 450-462.

"DDR4 Registering Clock Driver—DDR4RCD01", JEDEC Solid State Technology Association, Aug. 2016, pp. 1-138, JEDEC Standard No. 82-31.

"DDR4 SDRAM Load Reduced Dimm Design Specification", JEDEC, Aug. 2015, pp. 1-41, JEDEC Standard No. 21C.

"DDR4 SDRAM Registered DIMM Design Specification", JEDEC, May 2019, pp. 1-45, JEDEC Standard No. 21C.

"DDR4 SDRAM Standard", JEDEC Solid State Technology Association, Nov. 2013, pp. 1-208, JEDEC Standard No. 79-4A.

Micron, "DDR4 SDRAM System-Power Calculator", Jul. 9, 2019, pp. 1.

Dimitris Kaseridis et al., "Minimalist Open-page: A DRAM Page-mode Scheduling Policy for the Many-core Era", Micro'11, Dec. 3-7, 2011, pp. 24-35.

Eojin Lee et al., "TWiCe: Time Window Counter Based Row Refresh to Prevent Row-Hammering", IEEE Computer Architecture Letters, Jan.-Jun. 2018, pp. 96-99, vol. 17, No. 1.

"Graphic Double Data Rate 5 (GDDR5) Specification", JEDEC Solid State Technology Association, Feb. 2016, pp. 1-149, JEDEC Standard No. 212C.

Hadi Asghari-Moghaddam et al., "Chameleon: Versatile and Practical Near-DRAM Acceleration Architecture for Large Memory Systems", IEEE, 2016, pp. 1-13.

Harshad Kasture et al., "TailBench: A Benchmark Suite and Evaluation Methodology for Latency-Critical Applications", IEEE, 2016, pp. 3-12.

Hyeontaek Lim et al., "MICA: A Holistic Approach to Fast In-Memory Key-Value Storage", USENIX the advanced computing systems association, Apr. 2-4, 2014, pp. 429-444.

"Intel Xeon Processor E5 v3 Product Family Specification Update", Sep. 2017, pp. 1-47.

Ishwar Bhati et al., "DRAM Refresh Mechanisms, Penalties, and Trade-offs", IEEE Transactions on Computers, Jan. 2016, pp. 108-121, vol. 65, No. 1.

Jack Doweck et al., "Inside 6th-Generation Intel Core: New Microarchitecture Code-Named Skylake", IEEE Computer Society, 2017, pp. 52-62.

John L. Henning et al., "Spec CPU2006 Memory Footprint", ACM SIGARCH Computer Architecture News, Mar. 2007, pp. 84-89, vol. 35, No. 1.

Jung Ho Ahn et al., "McSimA+: A Manycore Simulator with Application-level+ Simulation and Detailed Microarchitecture Modeling", IEEE, 2013, pp. 74-85.

Jung Ho Ahn et al., "Multicore DIMM: an Energy Efficient Memory Module with Independently Controlled DRAMs", IEEE Computer Architecture Letters, Jan.-Jun. 2009, pp. 5-8, vol. 8, No. 1.

Kaveh Razavi et al., "Flip Feng Shui: Hammering a Needle in the Software Stack", USENIX the advanced computing systems association, Aug. 10-12, 2016, pp. 1-18.

Kyungbae Park et al., "Experiments and root cause analysis for active-precharge hammering fault in DDR3 SDRAM under 3× nm technology", Microelectronics Reliability 57, 2016, pp. 39-46, Elsevier.

"Low Power Double Data Rate 4 (LPDDR4)", JEDEC Solid State Technology Association, Feb. 2017, pp. 1-301, JEDEC Standard No. 209-4B.

Mark Seaborn et al., "Exploiting the DRAM Rowhammer Bug to Gain Kernel Privileges", 2015, pp. 1-71, Black Hat 15.

Masashi Horiguchi et al., "Nanoscale Memory Repair", Integrated Circuits and Systems, 2013, pp. 1-5, Springer.

Michael Huang et al., "L1 Data Cache Decomposition for Energy Efficiency", Aug. 6-7, 2001, pp. 10-15.

Misiker Tadesse Aga et al., "When Good Protections Go Bad: Exploiting Anti-DoS Measures to Accelerate Rowhammer Attacks", IEEE International Symposium on Hardware Oriented Security and Trust (HOST), 2017, pp. 8-13.

Mungyu Son et al., "Making DRAM Stronger Against Row Hammering", DAC'17, Jun. 2017, pp. 1-6.

Nishad Herath et al., "These are Not Your Grand Daddys CPU Performance Counters—CPU Hardware Performance Counters for Security", Black Hat, 2015, pp. 1-89.

Onur Mutlu et al., "Parallelism-Aware Batch Scheduling: Enhancing both Performance and Fairness of Shared DRAM Systems", IEEE International Symposium on Computer Architecture, 2008, pp. 63-74.

Onur Mutlu et al., "RowHammer: A Retrospective", Apr. 22, 2019, pp. 1-16, arXiv:1904.09724v1 [cs.CR].

Sanguhn Cha et al., "Defect Analysis and Cost-Effective Resilience Architecture for Future DRAM Devices", IEEE International Symposium on High Performance Computer Architecture, 2017, pp. 61-72.

Satish Kumar Sadasivam et al., "IBM Power9 Processor Architecture", IEEE, 2017, pp. 40-51, IEEE Computer Society.

Scott Beamer et al., "The GAP Benchmark Suite", May 18, 2017, pp. 1-16, arXiv:1508.03619v4 [cs.DC], Electrical Engineering & Computer Sciences Department, University of California, Berkeley, California.

Seyed Mohammad Seyedzadeh et al., "Counter-Based Tree Structure for Row Hammering Mitigation in DRAM", IEEE Computer Architecture Letters, Jan.-Jun. 2017, pp. 18-21, vol. 16, No. 1.

Seyed Mohammad Seyedzadeh et al., "Mitigating Wordline Crosstalk using Adaptive Trees of Counters", ACM/IEEE 45th Annual International Symposium on Computer Architecture, 2018, pp. 612-623, IEEE Computer Society.

Teja Singh et al., "Zen: An Energy-Efficient High-Performance × 86 Core", IEEE Journal of Solid-State Circuits, Jan. 2018, pp. 102-114, vol. 53, No. 1.

Thomas Yang et al., "Trap-Assisted DRAM Row Hammer Effect", IEEE Electron Device Letters, Mar. 2019, pp. 391-394, vol. 40, No. 3.

Timothy Sherwood et al., "Automatically Characterizing Large Scale Program Behavior", 2002, pp. 45-57.

Victor Van Der Veen et al., "Drammer: Deterministic Rowhammer Attacks on Mobile Platforms", CCS'16, Oct. 24-28, 2016, pp. 1-15.

Xianwei Zhang et al., "DrMP: Mixed Precision-Aware DRAM for High Performance Approximate and Precise Computing", 26th International Conference on Parallel Architectures and Compilation Techniques, 2017, pp. 53-63, IEEE Computer Society.

Yoongu Kim et al., "Flipping Bits in Memory Without Accessing Them: An Experimental Study of DRAM Disturbance Errors", IEEE, 2014, pp. 1-12.

Young Hoon Son et al., "CiDRA: A Cache-inspired DRAM Resilience Architecture", IEEE, 2015, pp. 502-513.

\* cited by examiner

ROW HAMMER PREVENTION CIRCUIT, A MEMORY MODULE INCLUDING THE ROW HAMMER PREVENTION CIRCUIT, AND A MEMORY SYSTEM INCLUDING THE MEMORY MODULE

CROSS-REFERENCE TO RELATED APPLICATION

The present application claims priority under 35 U.S.C. § 119(a) to Korean Patent Application No. 10-2019-0095516, filed on Aug. 6, 2019, which is incorporated herein by reference in its entirety.

BACKGROUND

1. Technical Field

Various embodiments generally relate to a technology for substantially preventing a row hammer phenomenon in a memory chip included a memory module by using a row hammer prevention circuit provided in the memory module.

2. Related Art

In a semiconductor memory device such as DRAM, a row hammer phenomenon is known in which data of cells connected to word lines are damaged when neighboring word line is continuously activated.

In order to prevent the row hammer phenomenon, a row hammer prevention function may be performed by counting the number of accesses to a word line accesses in a memory controller or in a memory chip.

When the number of accesses to each word line is individually managed, space for storing the number of accesses may be excessively increased.

Also, when a conventional memory controller performs row hammer prevention function for all memory chips, as the number of memory chips managed by the memory controller increases, design of the memory controller for the row hammer prevention function may be changed.

In addition, when the conventional memory controller performs the row hammer prevention function for all memory chips, as the number of memory chips managed by the memory controller increases, the control operation for the row hammer prevention function may delay the processing time of general memory control operations.

SUMMARY

In accordance with an embodiment of the present disclosure, a row hammer prevention circuit for providing a reference address to perform an additional refresh operation may include a history storage circuit configured to store one or more first addresses, each of the first addresses having been provided as the reference address; an address storage circuit configured to store a row address corresponding to an active command; a reference address storage circuit configured to store one or more second addresses; and a control circuit configured to provide the reference address in response to a refresh command.

In accordance with an embodiment of the present disclosure, a memory module may include a row hammer prevention circuit configured to provide a reference address for an additional refresh operation according to a refresh command; and a memory chip configured to receive the refresh command and the reference address and to perform the additional refresh operation.

In accordance with an embodiment of the present disclosure, a memory system may include a memory controller configured to provide a command signal and an address signal; and a memory module configured to operate according to the command signal and the address signal, and to transmit a data signal to the memory controller or receive the data signal from the memory controller, wherein the memory module includes a row hammer prevention circuit configured to provide a reference address for an additional refresh operation according to a refresh command; and a memory chip configured to receive the refresh command and the reference address and to perform the additional refresh operation.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined in accordance with claims and equivalents thereof.

Figure 1:
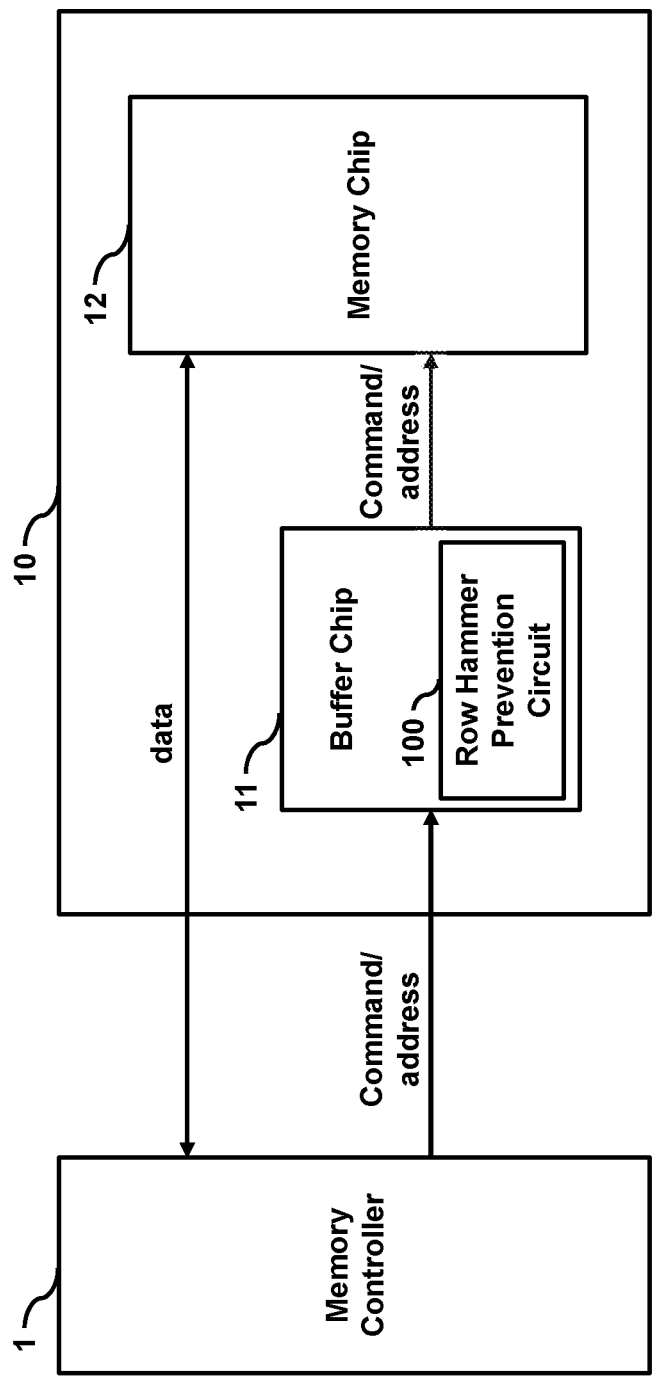
FIG. 1 is a block diagram illustrating a memory system according to an embodiment of the present disclosure.

FIG. 1 is a block diagram illustrating a memory system according to an embodiment of the present disclosure.

In the embodiment of FIG. 1, the memory system includes a memory controller 1 and a memory module 10. The memory module 10 includes a buffer chip 11 and a memory chip 12.

In general, the memory module 10 may include a plurality of memory chips 12, but only a single memory chip 12 is shown for convenience.

In addition, the memory system may include a plurality of memory modules 10, but only a single memory module 10 is shown for convenience.

The buffer chip 11 buffers a command signal and an address signal provided from the memory controller 1 and provides buffered command signal and address signal to the memory chip 12.

In this embodiment, data is provided directly to each memory chip 12 without passing through the buffer chip 11, but embodiments of the present disclosure are not limited thereto. For example, in another embodiment, the buffer chip 11 may buffer the data and provide buffered data to the memory chip 12.

In this embodiment, the memory chip 12 is a Dynamic Random Access Memory (DRAM), but a type of the memory chip 12 is not necessarily limited thereto, and the memory chip 12 may be another type of memory device in which row hammer phenomenon may occur due to word line activation.

The buffer chip 11 includes a row hammer prevention circuit 100.

The row hammer prevention circuit 100 senses the command signal and the address signal provided from the memory controller 1 to determine a reference address to be referred to during an additional refresh operation to substantially prevent the row hammer phenomenon.

In an embodiment, the additional refresh operation is a refresh operation that is additionally performed by referring to the reference address together with a normal refresh operation, the normal refresh operation being performed according to a refresh command such as an auto refresh command.

In an embodiment, the memory controller 1 provides the auto refresh command to the buffer chip 11 every unit refresh period.

The row hammer prevention circuit 100 outputs a reference address when an auto refresh command is applied.

The buffer chip 11 provides a reference address to the memory chip 12 together with the auto refresh command when the auto refresh command is applied.

The memory chip 12 performs an auto refresh operation according to the auto refresh command.

Detailed descriptions of performing the auto refresh operation in the memory chip 12 will be omitted herein for the interest of brevity.

In addition, the memory chip 12 further performs a refresh operation on an address neighboring a reference address additionally provided from the buffer chip 11. For example, when a reference address corresponds to a first word line, the memory chip 12 may further perform an additional refresh operation on a second word line that neighbors the first word line.

Performing a refresh operation on an address provided with the general auto refresh operation in the memory chip 12 is as described in Korean Patent Publication No. KR 10-2018-0022069 A.

Therefore, the detailed configuration and operation of the memory chip 12 performing the additional refresh operation will be omitted for the interest of brevity.

In an embodiment, the row hammer prevention circuit 100 is included in the buffer chip 11 of the memory module 10, but the row hammer prevention circuit 100 may be included in the memory module 1 as a separate chip from the buffer chip 11.

The row hammer prevention circuit 100 is effective in performing a row hammer prevention function for a plurality of memory chips 12 included in the memory module 10.

If one memory controller 1 performs the row hammer prevention function for the entire memory chips 12, the design of the memory controller 1 may be changed whenever the number of the memory modules 10 is changed.

On the other hand, if the row hammer prevention function is managed for each memory module 10 according to embodiments of the present disclosure, even if the number of memory modules 10 is changed, it may not necessary to change the design of the memory controller 1 for performing the row hammer prevention function.

That is, an embodiment (e.g., the embodiment shown in FIG. 1) of the present disclosure in which the row hammer prevention function is managed for each memory module 10 may be more advantageous when one memory controller 1 manages a plurality of memory modules 10.

If one memory controller 1 manages one memory module 10, the row hammer prevention circuit 100 according to an embodiment of the present disclosure may be located in the memory controller 1 instead of the memory module 10.

If the row hammer prevention function is performed for each memory chip 12, the area of a control circuit may be increased, thereby reducing the storage space efficiency and increasing the manufacturing cost. Therefore, the row hammer prevention function may be performed for each memory module 10, rather than for each memory chip 12.

A structure and an operation of the row hammer prevention circuit 100 will be described in more detail below.

Figure 2:
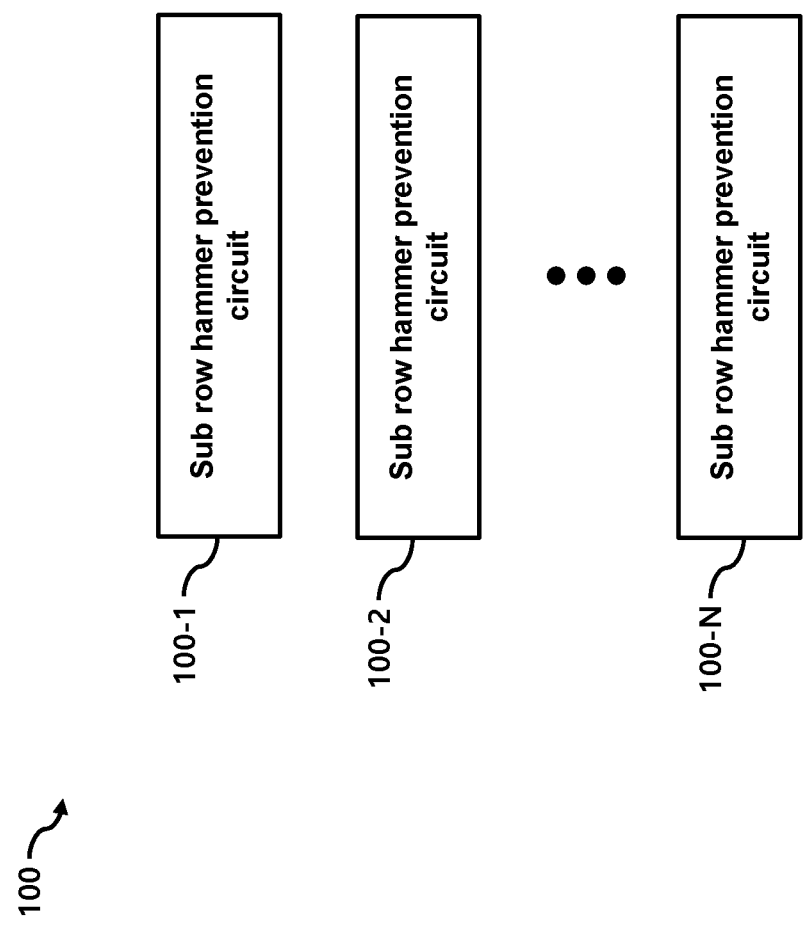
FIGS. 2 and 3 are block diagrams each illustrating a row hammer prevention circuit according to an embodiment of the present disclosure.

FIG. 2 is a block diagram illustrating a row hammer prevention circuit 100 according to an embodiment of the present disclosure. In an embodiment, the row hammer prevention circuit 100 of FIG. 2 may be suitable for use as the row hammer prevention circuit 100 of FIG. 1.

The row hammer prevention circuit 100 may manage all addresses allocated to the memory module 10 and may perform a row hammer prevention function.

When a command and an address are provided for each bank, the row hammer prevention circuit 100 may select a reference address per each bank and provide the reference address to the memory chip 12.

When selecting a reference address per each bank, the row hammer prevention circuit 100 may include a plurality of sub row hammer prevention circuits 100-1 to 100-N.

The plurality of sub row hammer prevention circuits 100-1 to 100-N have substantially the same configuration and operate in accordance with command signals and address signals for corresponding banks, respectively.

Each of the plurality of sub row hammer prevention circuits 100-1 to 100-N perform a row hammer prevention function on a corresponding bank.

Figure 3:
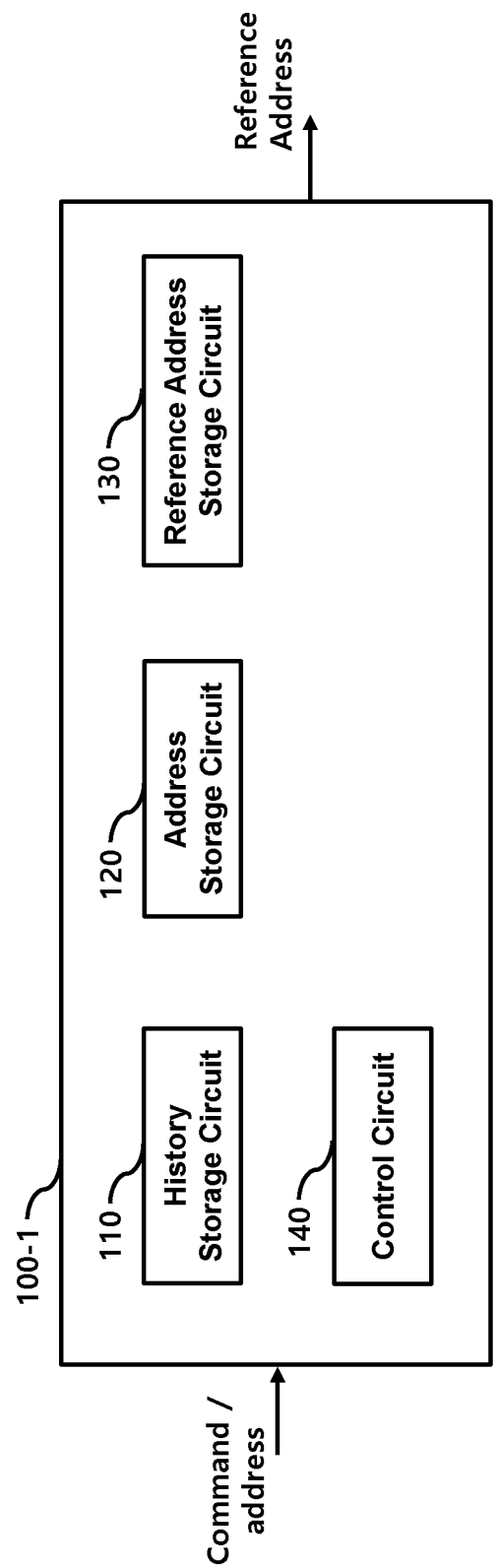

FIG. 3 is a block diagram illustrating a sub row hammer prevention circuit 100-1 according to an embodiment of the present disclosure. In an embodiment, the sub row hammer prevention circuit 100-1 of FIG. 3 may be suitable for use as the sub row hammer prevention circuit 100-1 of FIG. 2.

The sub row hammer prevention circuit 100-1 in FIG. 3 includes a history storage circuit 110, an address storage circuit 120, a reference address storage circuit 130, and a control circuit 140.

The history storage circuit 110 stores a given number of reference addresses that have been referred to for additional refresh operations.

The address storage circuit 120 stores a word line address, which may be a row address, where an active command is provided in order to select a reference address from the corresponding bank.

The reference address storage circuit 130 stores a reference address for a corresponding bank.

The control circuit 140 controls the history storage circuit 110, the address storage circuit 120, and the reference address storage circuit 130 to select a reference address to be referred to when performing an additional refresh operation in a corresponding bank by referring to the command signal and the address signal provided from the memory controller 1.

FIGS. 2 and 3 illustrate an embodiment in which a sub row hammer prevention circuit (e.g., the sub row hammer prevention circuit 100-1) is independently provided for each corresponding bank.

In another embodiment, the row hammer prevention circuit 100 may not be divided into a plurality of sub row hammer prevention circuits (e.g., the plurality of sub row hammer prevention circuits 100-1 to 100-N of FIG. 2).

In this case, the row hammer prevention circuit 100 may have a structure as shown in FIG. 3, where the row hammer prevention circuit 100 includes the history storage circuit 110, the address storage circuit 120, the reference address storage circuit 130, and the control circuit 140. The row hammer prevention function can be performed by dividing addresses into banks and selecting reference addresses for the respective banks.

A design having a plurality of sub row hammer prevention circuits as shown in FIG. 2 or a design where the whole sub row hammer prevention circuits are integrated into one row hammer prevention circuit as described above may be implemented according to embodiments.

Figure 4:
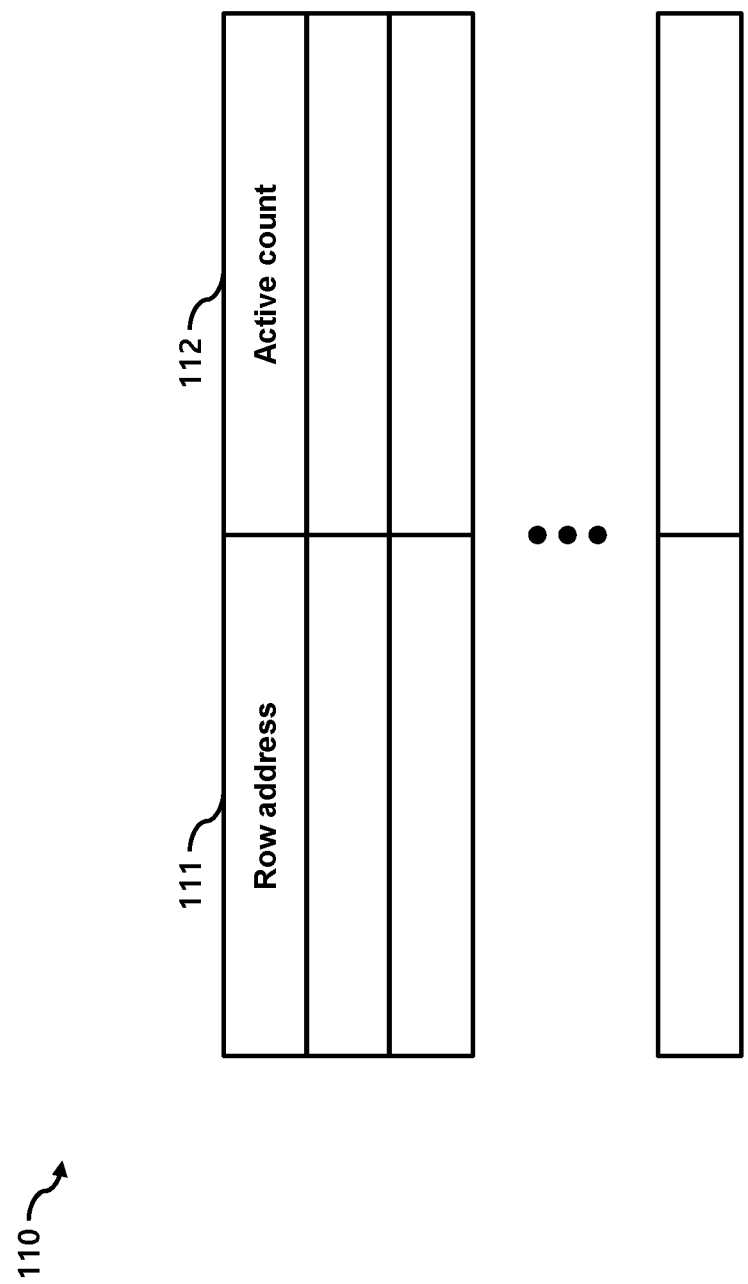
FIG. 4 is a block diagram illustrating a data structure stored in a history storage circuit according to an embodiment of the present disclosure.

FIG. 4 is a block diagram illustrating a data structure stored in a history storage circuit (e.g., the history storage circuit 110 of FIG. 3) according to an embodiment of the present disclosure.

In the embodiment of FIG. 4, the history storage circuit 110 stores a reference address that has been referred in the additional refresh operation for a corresponding bank.

In an embodiment, probability of referring to an address that was recently referred for an additional refresh operation is reduced because the row hammer phenomenon is less likely to occur with respect to an address recently been referred for an additional refresh operation.

The history storage circuit 110 stores a table having a structure that includes a row address field 111 and an active count field 112.

The row address field 111 stores a reference address previously selected for an additional refresh operation. For example, when the reference address corresponds to a first word line, a memory chip (e.g., the memory chip 12 of FIG. 1) performs an additional refresh operation on a second word line neighboring the first word line, thereby performing a row hammer prevention function.

The active count field 112 stores an active count for a corresponding row address.

The active count is incremented by a certain size, for example 1, when an active command is applied to a corresponding row address.

Each time an additional refresh operation is performed on a corresponding bank, the active counts corresponding to the entire row address of the corresponding bank may be increased by a predetermined size.

By using this, an address to which an active command is no longer to applied after being stored in the history storage circuit 110 may be removed from the history storage circuit 110. In an embodiment, the history storage circuit 110 may store a given number of addresses, select an address that has been stored for a longest period among the stored addresses, and remove the selected address before storing a new address. For example, the history storage circuit 110 may be implemented base on a first in, first out (FIFO) scheme.

Figure 5:
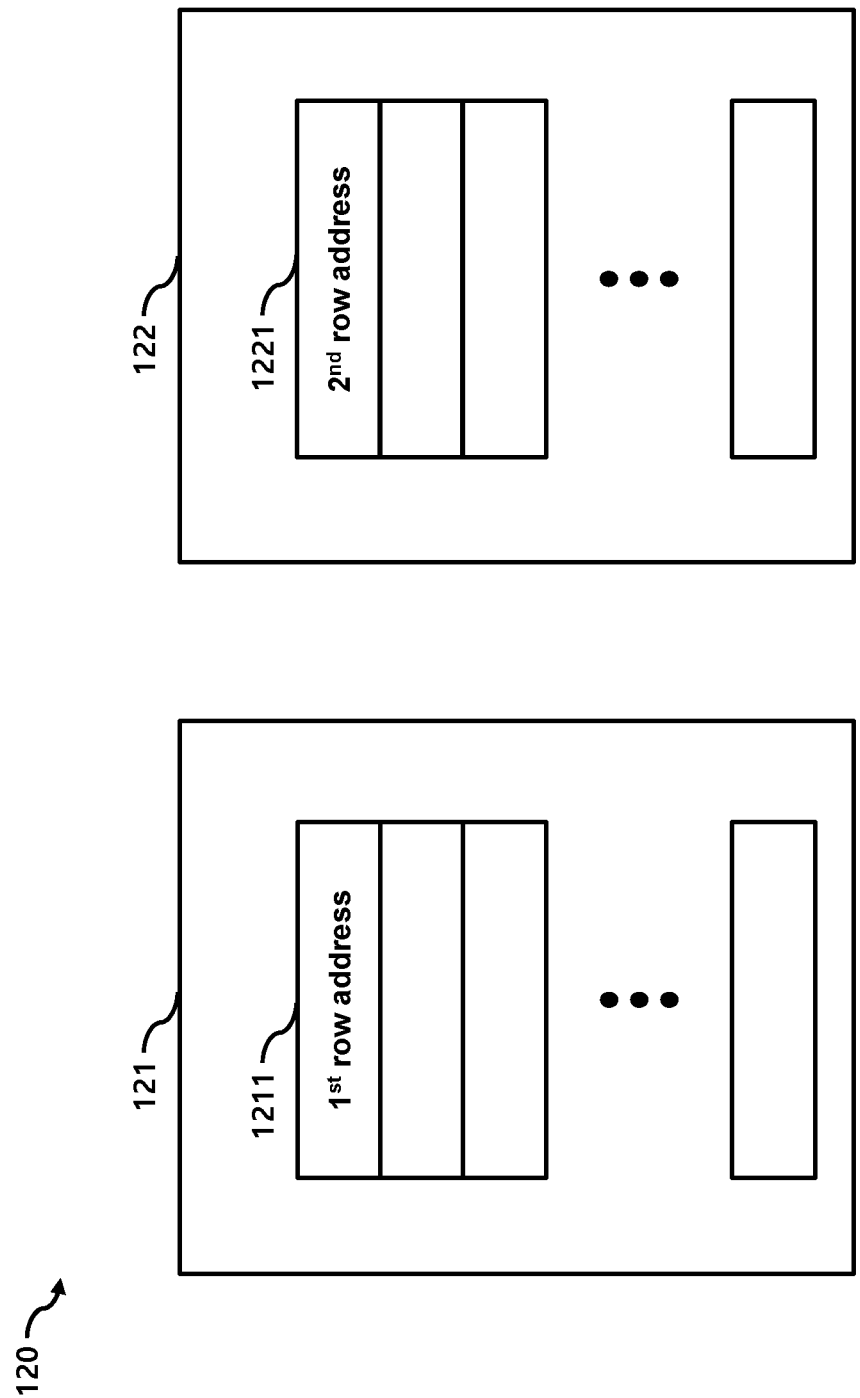
FIG. 5 is a block diagram illustrating a data structure stored in an address storage circuit according to an embodiment of the present disclosure.

FIG. 5 is a block diagram illustrating a data structure stored in an address storage circuit (e.g., the address storage circuit 120 in FIG. 3) according to an embodiment of the present disclosure.

In this embodiment, the address storage circuit 120 has a hierarchical structure including at least two stages.

The address storage circuit 120 includes a first address storage circuit 121 and a second address storage circuit 122.

The first address storage circuit 121 stores a table having a structure that includes a first row address field 1211, and the second address storage circuit 122 stores a table having a structure that includes a second row address field 1221.

The first address storage circuit 121 stores a corresponding row address whenever an active command is applied when the corresponding row address is not stored in the history storage circuit 110.

When the row address corresponding to the active command is stored in the history storage circuit 110, only the active count is incremented in the history storage circuit 110 without storing the row address in the first address storage circuit 121.

The second address storage circuit 122 randomly selects an address among the addresses stored in the first address storage circuit 121 and stores the selected address each time an auto refresh command is applied.

In this case, the second address storage circuit 122 may store the same address in duplicate. For example, when the selected address by the second address storage circuit 122 is the same as one of the addresses that have been stored therein, the second address storage circuit 122 stores the selected address again as a new entry for the second row address storage field 1221 while keeping the one that has been stored.

Figure 6:
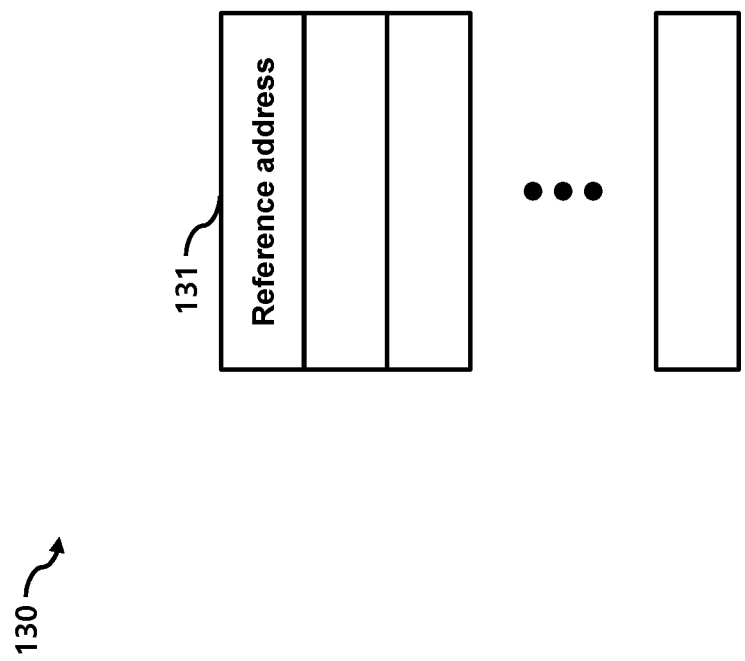
FIG. 6 is a block diagram illustrating a data structure stored in a reference address storage circuit according to an embodiment of the present disclosure.

FIG. 6 is a block diagram illustrating a data structure stored in a reference address storage circuit (e.g., the reference address storage circuit 130 in FIG. 3) according to an embodiment of the present disclosure.

The reference address storage circuit 130 stores a table having a structure that includes a reference address field 131.

When an auto refresh command is applied, the reference address storage circuit 130 may output the oldest address as a reference address.

When the auto refresh command is applied, an arbitrary address among the addresses stored in the second address storage circuit 122 is selected and stored in the reference address storage circuit 130.

In this case, the address selected from the second address storage circuit 122 may be stored together in the history storage circuit 110.

In an embodiment, the reference address storage circuit 130 may to store a queue data structure.

Figure 7:
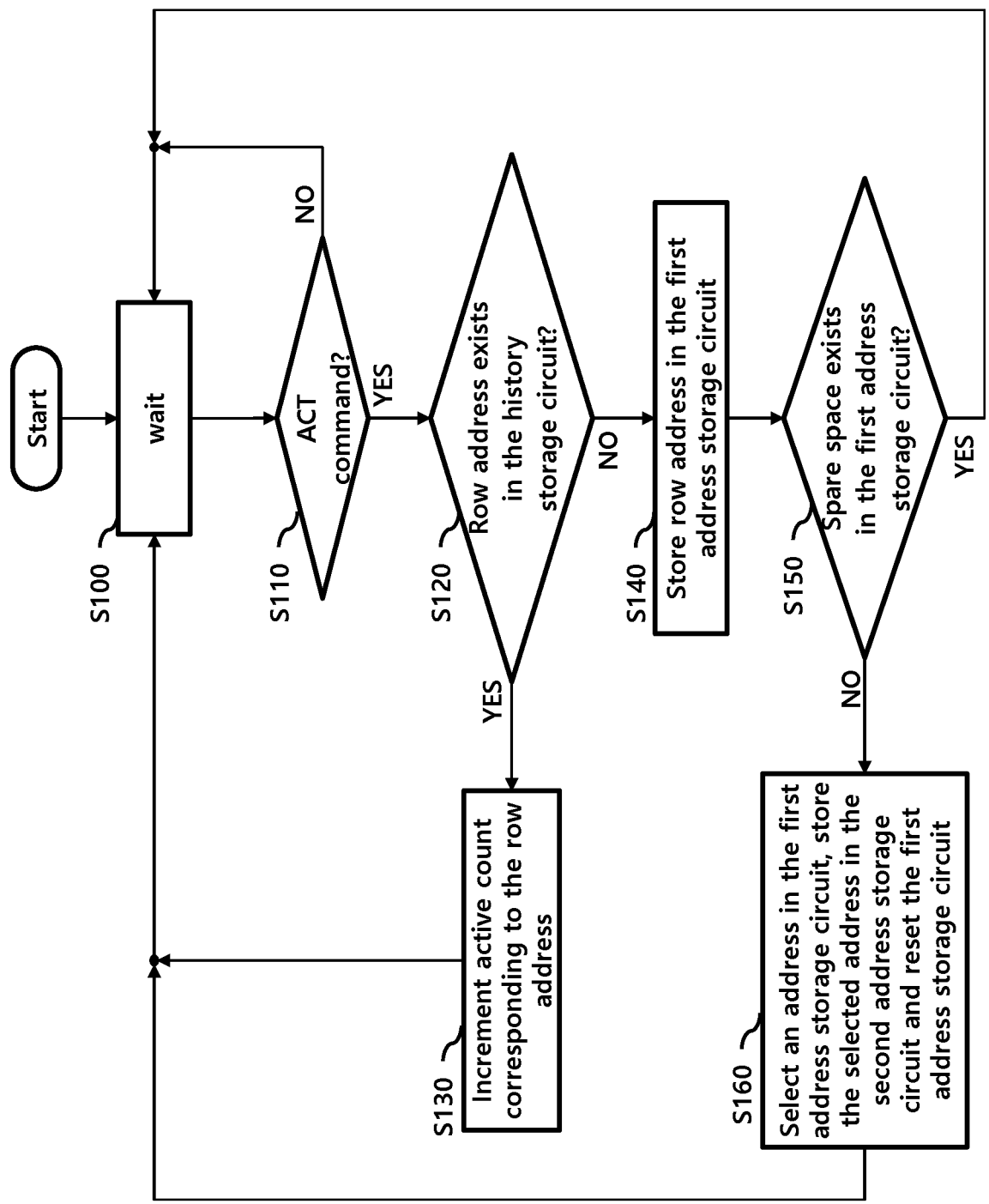
FIGS. 7 and 8 are flow charts each illustrating an operation of a row hammer prevention circuit according to an embodiment of the present disclosure.
Figure 8:
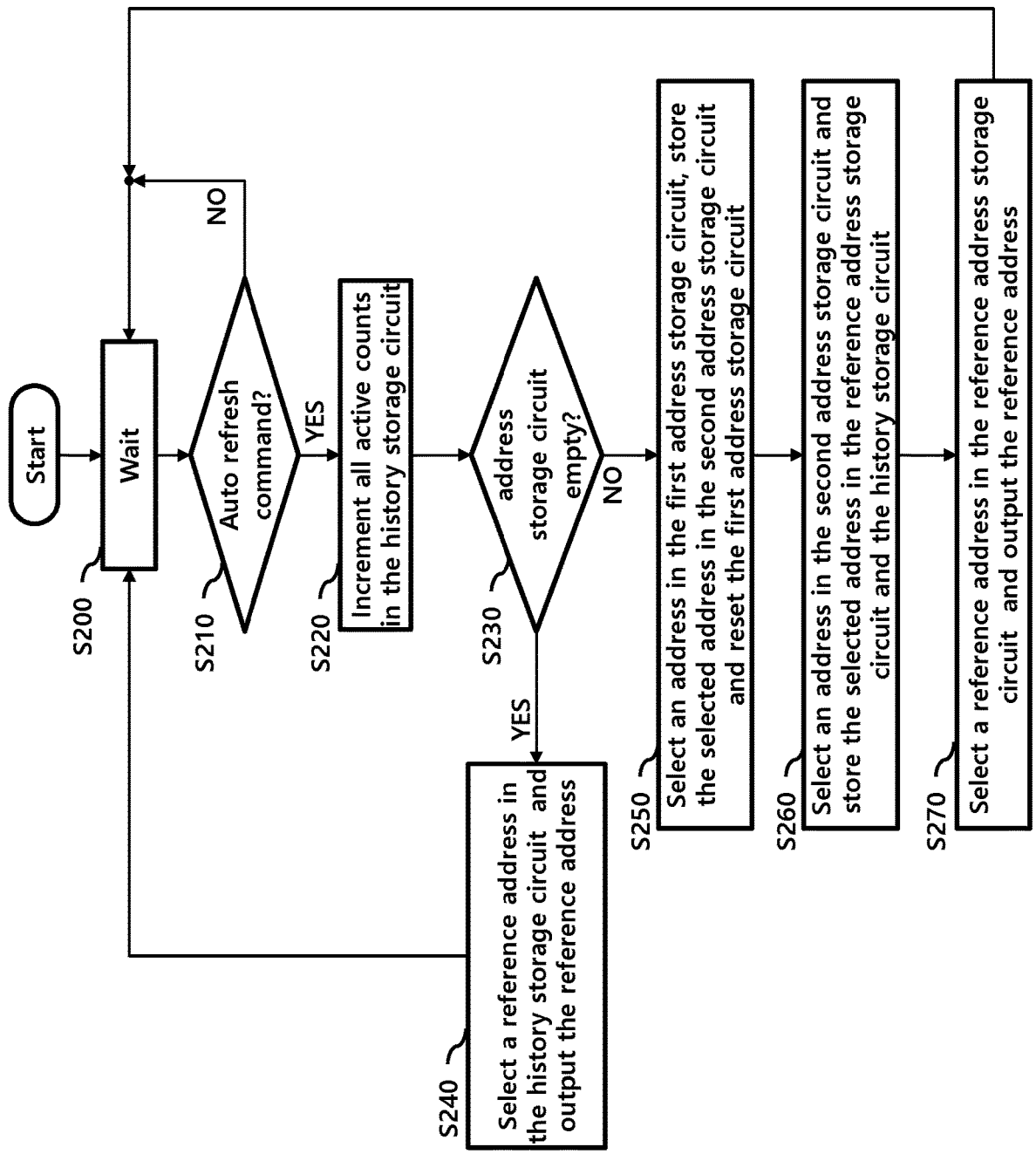

FIGS. 7 and 8 are flow charts each illustrating an operation of a row hammer prevention circuit (e.g., the row hammer prevention circuit 100 in FIG. 2) according to an embodiment of the present disclosure.

Since the operation may be performed independently per each bank, the operation may be performed independently at each of the sub row hammer prevention circuits 100-1 to 100-N of FIG. 2.

An operation disclosed in each of the flow charts of FIGS. 7 and 8 may be performed by a control circuit (e.g., the control circuit 140 in FIG. 3).

FIG. 7 is a flow chart for controlling an operation when an active command is applied according to an embodiment.

When the operation starts, it is in the wait step at S100 and then it is determined whether an active command is applied at S110.

If an active command is not applied, the process returns to the wait step at S100.

When an active command is applied, it is determined whether a row address corresponding to the active command is stored in the history storage circuit 110 at S120.

If a row address corresponding to an active command is stored in the history storage circuit 110, an active count corresponding to the row address is incremented in the history storage circuit 110 at S130 and the process returns to the wait step S100. The history storage circuit 110 according to an embodiment of the present disclosure stores a given number of addresses, each of which corresponds a target word line and is stored after performing an additional refresh operation on an adjacent word line to the target word line. When a row address corresponding to an active command is the same as an address stored in the history storage circuit 110 and corresponding to a target word line, the row address may not be stored in the first address storage circuit 121 for a given period of time. Thus, the address corresponding to the target word line may not be selected for performing an additional refresh operation on an adjacent word line to the target word line for the given period of time. Because the additional refresh operation may not be repeatedly performed on the same adjacent word line for the given period of time, a row hammer prevention circuit including the history storage circuit 110 according to an embodiment of the present disclosure may perform a row hammer prevention function more effectively compared to a conventional row hammer prevention circuit.

If a row address corresponding to the active command is not stored in the history storage circuit 110, a row address corresponding to the active command is stored in the first address storage circuit 121 at S140.

Thereafter, it is determined whether there is free space in the first address storage circuit 121 at S150.

If there is free space, the process returns to the wait step S100.

If there is no free space, the first address storage circuit 121 selects an address, stores a selected address in the second address storage circuit 122, and initializes the entire first address storage circuit 121 at S160. After performing S160, the process returns to the wait step S100.

When an address is selected in the first address storage circuit 121, an arbitrary address may be selected and then stored in the second address storage circuit 122. In an embodiment, the address storage circuit 120 has a two-level structure including the first address storage circuit 121 and the second address storage circuit 122. For example, when the first address storage circuit 121 and the second address storage circuit 122 may include a n number of address registers and an m number of address registers to store an n number of addresses and an m number of addresses, respectively, the total number (i.e., n+m) of address registers included in the address storage circuit 120 may be smaller than that (e.g., n*m) included in a conventional address storage circuit having a single level structure. As a result, a circuit area and power consumption of the address storage circuit 120 according to an embodiment of the present disclosure may be smaller than those of the conventional address storage circuit.

When a selected address is stored in the second address storage circuit 122, the second address storage circuit 122 may store the same address in duplicate.

FIG. 8 is a flow chart for controlling an operation when an auto refresh command is applied from a memory controller (e.g., the memory controller 1 of FIG. 1) according to an embodiment.

When the operation starts, it is in the wait step at S200 and then it is determined whether an auto refresh command is applied at S210.

When an auto refresh command is not applied, the process returns to the wait step at S200.

When an auto refresh command is applied, the active count is incremented by a predetermined size for the entire history storage circuit 110 at S220. In this case, the predetermined size may vary according to an embodiment.

Thereafter, it is determined whether the address storage circuit 120 is empty at S230.

If the address storage circuit 120 is empty, the history storage circuit 110 selects and outputs a reference address at S240 and the process returns to the wait step at S200.

An active count corresponding to a row address selected as the reference address in the history storage circuit 110 may be set to an initial value.

When the reference address is selected in the history storage circuit at S240, a value having the largest active count may be selected.

When the reference address is output from the row hammer prevention circuit 100, the buffer chip 11 provides the reference address to the memory chip 12 together with the auto refresh command provided from the memory controller 1.

If the address storage circuit 120 is not empty, an address is selected from the first address storage circuit 121 and stored in the second address storage circuit 122, and the first address storage circuit 121 is initialized at S250.

When the address is selected from the first address storage circuit 121, an arbitrary address may be selected. When the address is stored in the second address storage circuit 122, the same address may be stored in duplicate.

Thereafter, an address is selected from the second address storage circuit 122 and stored in the reference address storage circuit 130 and the history storage circuit 110 at S260.

When the address is selected from the second address storage circuit 122, an arbitrary address may be selected.

If the history storage circuit 110 is full, the history storage circuit 110 may evict a row address having the largest active count and store a selected address instead. At this time, the corresponding active count is set to an initial value.

Thereafter, the reference address storage circuit 130 selects and outputs a reference address at S270.

At this time, a reference address is removed from the reference address storage circuit 130.

When a reference address is selected and output, the oldest address stored in the reference address storage circuit 130 may be selected. Specifically, the address stored in the reference address storage circuit 130 for a longest period of time may be selected. For example, the reference address storage circuit 130 may be implemented base on a first in, first out (FIFO) scheme.

As described above, when the reference address is output from the row hammer prevention circuit 100, the buffer chip 11 provides a reference address to the memory chip 12 together with an auto refresh command provided from the memory controller 1.

The embodiment illustrated in FIG. 8 assumes that the row hammer prevention circuit 100 selects and outputs a reference address whenever an auto refresh command is applied. However, embodiments of the present disclosure are not limited thereto.

In another embodiment, the row hammer prevention circuit 100 may select a reference address every unit time and output a reference address when an auto refresh command is applied. For example, the row hammer prevention circuit 100 may select a reference address at regular time intervals, each of the time intervals being substantially constant.

In this case, a reference address that may cause a row hammer phenomenon can be selected every predetermined time though the memory controller 1 delays time when an auto refresh command is provided. For example, the row hammer prevention circuit 100 may select a reference address at regular time intervals, even when the memory controller 1 provides an auto refresh command to a memory module 10 including the row hammer prevention circuit 100 with a delay.

Figure 9:
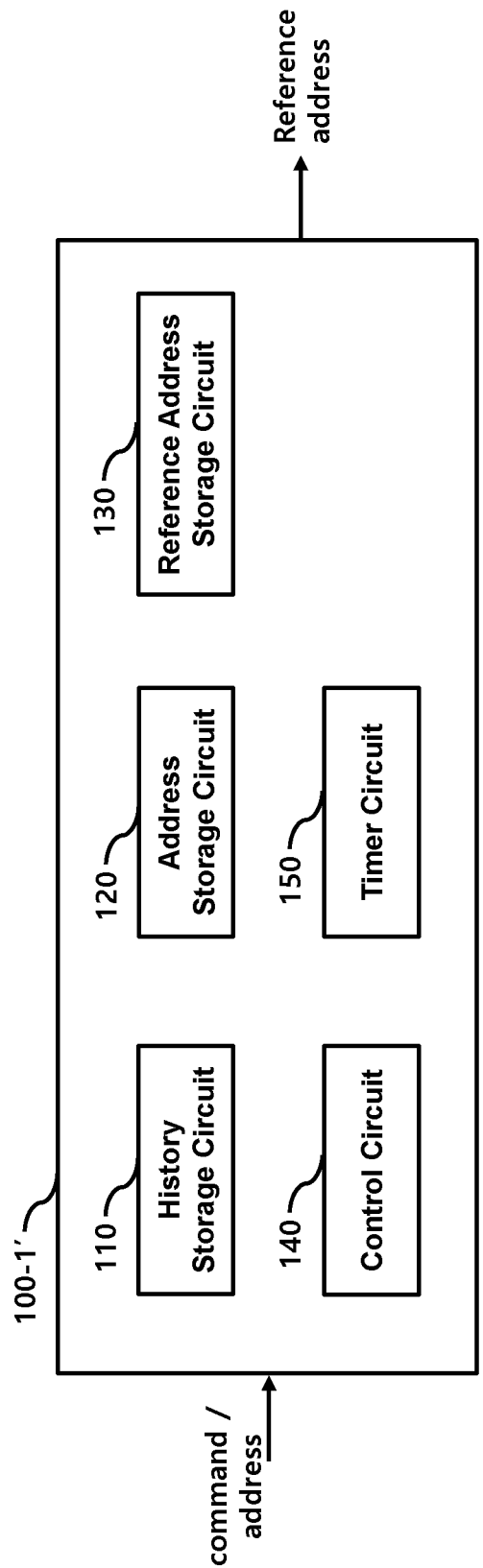
FIG. 9 is a block diagram illustrating a row hammer prevention circuit according to another embodiment of the present disclosure.

FIG. 9 shows a block diagram of a sub row hammer prevention circuit 100-1' including a timer circuit 150 according to an embodiment.

The timer circuit 150 indicates whether a unit time (or a unit time interval) has elapsed for a corresponding bank.

In an embodiment, the timer circuit 150 may indicate an elapse of the unit time in synchronization with a time when a first auto refresh command is applied to a corresponding bank.

In this case, the unit time may be as long as or shorter than a unit refresh period.

The configuration and operation of the history storage circuit 110, the address storage circuit 120, the reference address storage circuit 130, and the control circuit 140 are substantially the same as those described above with reference to FIGS. 3 to 6.

The operations of FIG. 7 performed when an active command is input may be similarly performed in the embodiment of FIG. 9. However, the operation of FIG. 8 needs to be changed to the operations of FIGS. 10 and 11. Specifically, when an auto refresh command is applied, the embodiment of FIG. 9 may perform the operations of FIGS. 10 and 11, rather than the operation of FIG. 8.

Figure 10:
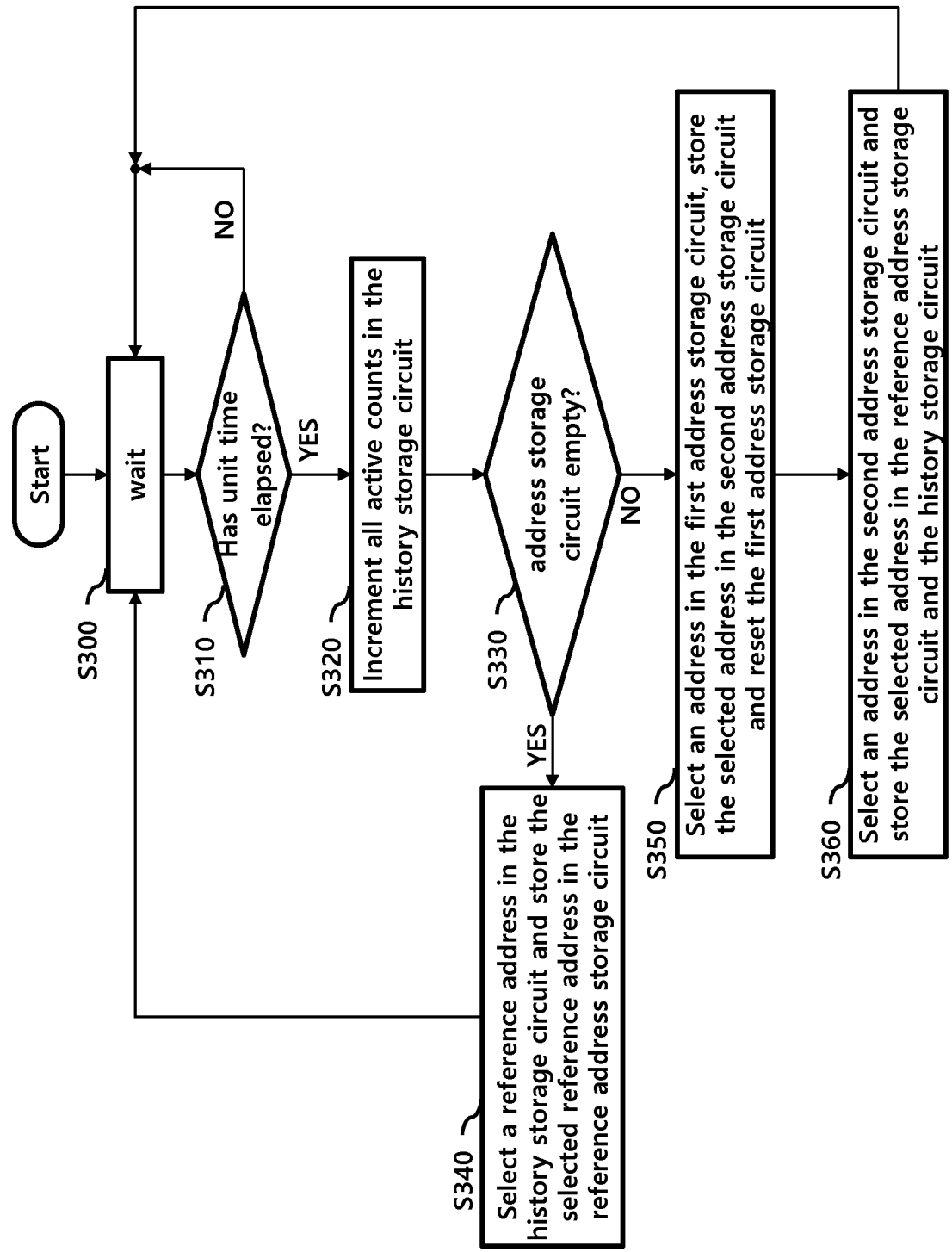
FIGS. 10 and 11 are flow charts each illustrating an operation of a row hammer prevention circuit according to another embodiment of the present disclosure.

FIG. 10 is a flow chart showing an operation of selecting a reference address according to an embodiment.

When the operation starts, it is in the wait step at S300 and then it is determined whether the unit time (or unit time interval) has elapsed at S310.

If the unit time has not elapsed, the process returns to the wait state at S300.

If the unit time has elapsed, the active count is incremented for the entire history storage circuit 110 by a predetermined size at S320. In this case, the predetermined size may vary according to embodiments.

After that, it is determined whether the address storage circuit 120 is empty at S330.

If the address storage circuit 120 is empty, a reference address is selected from the history storage circuit 110, and stored in the reference address storage circuit 130 at S340. And then the process returns to the wait at S300.

When the reference address is selected in the history storage circuit 110 at S340, a value having the largest active count may be selected. The active count corresponding to the selected reference address may be initialized.

If the address storage circuit 120 is not empty, the address is selected from the first address storage circuit 121 and stored in the second address storage circuit 122, and the first address storage circuit 121 is initialized at S350.

When the address is selected from the first address storage circuit 121, an arbitrary address may be selected. When the address is stored in the second address storage circuit 122, the same address may be stored in duplicate.

Thereafter, the address is selected from the second address storage circuit 122 and stored in the reference address storage circuit 130 and in the history storage circuit 110 at S360. And then the process returns to the wait step at S300.

When an address is selected from the second address storage circuit 122, an arbitrary address may be selected.

In this case, if there is no free space in the history storage circuit 110, the row address having the largest active count may be evicted and the reference address may be stored instead. The active count corresponding to the newly stored row address may be initialized.

Figure 11:
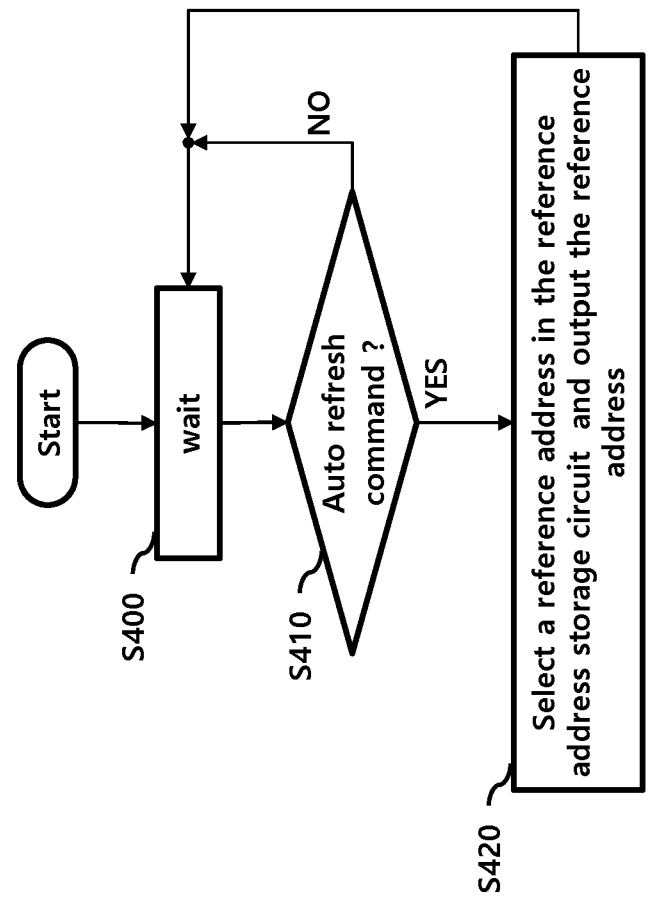

FIG. 11 is a flow chart illustrating an operation of outputting a reference address according to an embodiment.

When the operation starts, it is in the wait step at S400 and it is determined whether an auto refresh command is applied at S410.

If an auto refresh command is not applied, the process returns to the wait step at S400.

If an auto refresh command is applied, the reference address storage circuit 130 selects and outputs a reference address at S420.

At this time, the selected reference address is removed from the reference address storage circuit 130.

When the reference address is selected and output, the oldest address stored in the reference address storage circuit 130 may be selected.

As described above, when the reference address is output from the row hammer prevention circuit 100, the buffer chip 11 may provide the reference address to the memory chip 12 together with the auto refresh command provided from the memory controller 1.

Although various embodiments have been described for illustrative purposes, various changes and modifications may be made to the described embodiments without departing from the spirit and scope of the disclosure as defined by the following claims.

What is claimed is:

1. A row hammer prevention circuit for providing a reference address to perform an additional refresh operation, the circuit comprising:
   a history storage circuit configured to store one or more first addresses, each of the first addresses having been provided as the reference address, the reference address corresponding to a target word line to perform the additional refresh operation on one or more word lines adjacent to the target word line;
   an address storage circuit configured to store a row address corresponding to an active command;
   a reference address storage circuit configured to store one or more second addresses; and
   a control circuit configured to provide the reference address in response to a refresh command.

2. The row hammer prevention circuit of claim 1, wherein the history storage circuit further stores one or more active counts corresponding to the first addresses, respectively, wherein, when the row address corresponding to the active command is not stored in the history storage circuit, the control circuit stores the row address in the address storage circuit, and wherein, when the row address corresponding to the active command is stored in the history storage circuit, the control circuit increments an active count corresponding to the row address.

3. The row hammer prevention circuit of claim 2, wherein the address storage circuit includes a first address storage circuit and a second address storage circuit, and wherein, when the row address corresponding to the active command is not stored in the history storage circuit, the control circuit stores the row address in the first address storage circuit.

4. The row hammer prevention circuit of claim 3, wherein the control circuit stores a third address selected from the first address storage circuit in the second address storage circuit, stores a fourth address selected from the second address storage circuit in the reference address storage circuit and in the history storage circuit, and outputs a fifth address selected from the reference address storage circuit as the reference address when a unit time interval has elapsed or when the refresh command is input.

5. The row hammer prevention circuit of claim 4, wherein the control circuit initializes the first address storage circuit after the control circuit selects the third address from the first address storage circuit.

6. The row hammer prevention circuit of claim 5, wherein the control circuit outputs the fifth address selected from the reference address storage circuit as the reference address when the refresh command is input.

7. The row hammer prevention circuit of claim 1, wherein the control circuit stores an address selected from the address storage circuit in the reference address storage circuit and in the history storage circuit, and outputs an address selected from the reference address storage circuit as the reference address when a unit time interval has elapsed or when the refresh command is input.

8. The row hammer prevention circuit of claim 1, wherein the address storage circuit has a two-level structure including a first address storage circuit and a second address storage circuit, and wherein the second address storage circuit randomly selects a third address from the first address storage circuit and stores the selected third address.

9. A memory module, comprising:
a row hammer prevention circuit configured to provide a reference address for an additional refresh operation according to a refresh command; and
a memory chip configured to receive the refresh command and the reference address and to perform the additional refresh operation,
wherein the row hammer prevention circuit comprises:
a history storage circuit configured to store one or more first addresses, each of the first addresses having been provided as the reference address, the reference address corresponding to a target word line to perform the additional refresh operation on one or more word lines adjacent to the target word line;
an address storage circuit configured to store a row address corresponding to an active command;
a reference address storage circuit configured to store one or more second addresses; and
a control circuit configured to provide the reference address in response to the refresh command.

10. The memory module of claim 9, wherein the history storage circuit further stores one or more active counts corresponding to the first addresses, respectively, wherein when the row address corresponding to the active command is not stored in the history storage circuit, the control circuit stores the row address in the address storage circuit, and wherein when the row address corresponding to the active command is stored in the history storage circuit, the control circuit increments an active count corresponding to the row address.

11. The memory module of claim 10, wherein the address storage circuit includes a first address storage circuit and a second address storage circuit, and wherein, when the row address corresponding to the active command is not stored in the history storage circuit, the control circuit stores the row address in the first address storage circuit.

12. The memory module of claim 11, wherein the control circuit stores a third address selected from the first address storage circuit in the second address storage circuit, stores a fourth address selected from the second address storage circuit in the reference address storage circuit and in the history storage circuit, and outputs a fifth address selected from the reference address storage circuit as the reference address when a unit time interval has elapsed or when the refresh command is input.

13. The memory module of claim 12, wherein the control circuit initializes the first address storage circuit after the control circuit selects the third from the first address storage circuit.

14. The memory module of claim 12, wherein the control circuit outputs the fifth address selected from the reference address storage circuit as the reference address when the refresh command is input.

15. The memory module of claim 9, wherein the control circuit stores an address selected from the address storage circuit in the reference address storage circuit and in the history storage circuit, and outputs an address selected from the reference address storage circuit as the reference address when a unit time interval has elapsed or when the refresh command is input.

16. The memory module of claim 9, further comprising:
a buffer chip configured to buffer a command and an address provided from a memory controller,
wherein the row hammer prevention circuit is comprised in the buffer chip.

17. A memory system comprising:
a memory controller configured to provide a command signal and an address signal; and
a memory module configured to operate according to the command signal and the address signal, and to transmit a data signal to the memory controller or receive the data signal from the memory controller, wherein the memory module includes:
a row hammer prevention circuit configured to provide a reference address for an additional refresh operation according to a refresh command; and
a memory chip configured to receive the refresh command and the reference address and to perform the additional refresh operation,
wherein the row hammer prevention circuit comprises:
a history storage circuit configured to store one or more first addresses, each of the first addresses having been provided as the reference address, the reference address corresponding to a target word line to perform the additional refresh operation on one or more word lines adjacent to the target word line;

an address storage circuit configured to store a row address corresponding to an active command;

a reference address storage circuit configured to store one or more second addresses; and a control circuit configured to provide the reference address in response to the refresh command.

18. The memory module of claim 17, wherein the history storage circuit further stores one or more active counts corresponding to the first addresses, respectively, wherein when the row address corresponding to the active command is not stored in the history storage circuit, the control circuit stores the row address in the address storage circuit, and wherein when the row address corresponding to the active command is stored in the history storage circuit, the control circuit increments an active count corresponding to the row address.

19. The memory system of claim 18, wherein the control circuit stores an address selected from the address storage circuit in the reference address storage circuit and in the history storage circuit, and outputs an address selected from the reference address storage circuit as the reference address when a unit time interval has elapsed or when the refresh command is input.

20. The memory system of claim 17, wherein the memory module further comprises a buffer chip configured to buffer the command signal and the address signal provided from the memory controller, and wherein the row hammer prevention circuit is comprised in the buffer chip.

\* \* \* \* \*